(12) United States Patent  
Kim

(10) Patent No.: US 7,327,173 B2  
(45) Date of Patent: Feb. 5, 2008

(54) DELAY-LOCKED LOOP HAVING A PRE-SHIFT PHASE DETECTOR

(75) Inventor: Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 11/344,988

(22) Filed: Jan. 31, 2006

(65) Prior Publication Data

US 2006/0120208 A1 Jun. 8, 2006

Related U.S. Application Data

(62) Division of application No. 10/931,354, filed on Aug. 31, 2004, now Pat. No. 7,088,156.

(51) Int. Cl.
*H03L 7/06* (2006.01)

(52) U.S. Cl. ............... 327/149; 327/144; 327/146; 327/153; 327/156; 327/158; 327/161; 327/236; 327/244

(58) Field of Classification Search ........ 327/149, 327/144, 146, 153, 156, 158, 161, 236, 244
See application file for complete search history.

(56) References Cited

U.S. PATENT DOCUMENTS

| | | | |
|---|---|---|---|
| 4,868,514 A * | 9/1989 | Azevedo et al. ............ 327/159 |
| 5,118,975 A | 6/1992 | Hillis et al. ................ 307/602 |
| 5,272,729 A | 12/1993 | Bechade et al. ............ 375/118 |
| 5,410,263 A | 4/1995 | Waizman .................. 327/141 |
| 5,537,068 A | 7/1996 | Konno ..................... 327/115 |
| 5,537,069 A | 7/1996 | Volk ....................... 327/149 |
| 5,717,652 A | 2/1998 | Ooishi .................... 365/233 |
| 5,724,007 A | 3/1998 | Mar ....................... 331/1 A |
| 5,790,612 A | 8/1998 | Chengson et al. .......... 375/373 |
| 5,801,559 A * | 9/1998 | Sawai et al. ............... 327/116 |
| 5,815,016 A | 9/1998 | Erickson .................. 327/158 |
| 5,825,226 A | 10/1998 | Ferraiolo et al. .......... 327/250 |
| 5,889,336 A | 3/1999 | Tateishi .................. 290/53 |
| 5,892,406 A * | 4/1999 | Dicke et al. .............. 331/10 |
| 5,935,257 A | 8/1999 | Nishimura ................ 713/503 |
| 5,936,912 A * | 8/1999 | Kawabata et al. .......... 365/233 |

(Continued)

FOREIGN PATENT DOCUMENTS

EP 1 276 240 A2 7/2002

OTHER PUBLICATIONS

Micron Technology, Inc., "DDR SDRAM Functionality and Controller Read Data Capture", Design Line, vol. 8, Issue 3, 3Q99, 1999. 24 pages, Aug. 18, 2007.

*Primary Examiner*—Viet Q. Nguyen
(74) *Attorney, Agent, or Firm*—Dorsey & Whitney LLP

(57) ABSTRACT

A clock generator for generating an output clock signal synchronized with an input clock signal having first and second adjustable delay lines. The first adjustable delay lines is adjusted following initialization of the clock generator to expedite obtaining a lock condition following the initialization. The second adjustable delay line is adjusted after synchronization is achieved with the first adjustable delay line, or when the first adjustable delay line reaches a maximum adjustable delay. The first adjustable delay line is reset when a lock condition is initially obtained, and the second adjustable delay line is adjusted to compensate for the resetting of the first adjustable delay line.

3 Claims, 5 Drawing Sheets

U.S. PATENT DOCUMENTS

| | | | |
|---|---|---|---|
| 5,940,609 A | 8/1999 | Harrison | 395/558 |
| 5,994,934 A * | 11/1999 | Yoshimura et al. | 327/158 |
| 6,049,239 A | 4/2000 | Eto et al. | 327/158 |
| 6,069,504 A * | 5/2000 | Keeth | 327/108 |
| 6,069,506 A | 5/2000 | Miller, Jr. et al. | 327/156 |
| 6,078,514 A | 6/2000 | Takemae et al. | 365/63 |
| 6,087,868 A | 7/2000 | Millar | 327/156 |
| 6,088,255 A | 7/2000 | Matsuzaki et al. | 365/76 |
| 6,101,197 A * | 8/2000 | Keeth et al. | 370/517 |
| 6,140,854 A * | 10/2000 | Coddington et al. | 327/158 |
| 6,150,859 A | 11/2000 | Park | 327/158 |
| 6,157,226 A * | 12/2000 | Ishimi | 327/116 |
| 6,172,537 B1 | 1/2001 | Kanou et al. | 327/99 |
| 6,173,432 B1 | 1/2001 | Harrison | 716/1 |
| 6,204,705 B1 | 3/2001 | Lin | 327/161 |
| 6,212,126 B1 | 4/2001 | Sakamoto | 365/233 |
| 6,229,363 B1 * | 5/2001 | Eto et al. | 327/158 |
| 6,265,918 B1 * | 7/2001 | Toda | 327/146 |
| 6,285,172 B1 | 9/2001 | Torbey | 323/237 |
| 6,294,938 B1 * | 9/2001 | Coddington et al. | 327/158 |
| 6,316,976 B1 | 11/2001 | Miller, Jr. et al. | 327/156 |
| 6,337,590 B1 | 1/2002 | Millar | 327/158 |
| 6,346,839 B1 * | 2/2002 | Mnich | 327/158 |
| 6,373,913 B1 | 4/2002 | Lee | 375/376 |
| 6,404,248 B1 | 6/2002 | Yoneda | 327/158 |
| 6,437,619 B2 * | 8/2002 | Okuda et al. | 327/158 |
| 6,448,820 B1 | 9/2002 | Wang et al. | 327/12 |
| 6,466,491 B2 * | 10/2002 | Yanagawa | 365/194 |
| 6,504,408 B1 | 1/2003 | von Kaenel | 327/158 |
| 6,556,489 B2 | 4/2003 | Gomm et al. | 365/194 |
| 6,556,643 B2 | 4/2003 | Merritt | 377/16 |
| 6,605,969 B2 | 8/2003 | Mikhalev et al. | 327/158 |
| 6,628,154 B2 | 9/2003 | Fiscus | 327/158 |
| 6,636,093 B1 * | 10/2003 | Stubbs et al. | 327/161 |
| 6,639,958 B1 | 10/2003 | Hohler et al. | 375/376 |
| 6,664,830 B2 | 12/2003 | Miller | 327/158 |
| 6,680,874 B1 | 1/2004 | Harrison | 365/233 |
| 6,724,228 B2 * | 4/2004 | Kashiwazaki | 327/158 |
| 6,727,739 B2 * | 4/2004 | Stubbs et al. | 327/161 |
| 6,728,163 B2 | 4/2004 | Gomm et al. | 365/233 |
| 6,759,911 B2 | 7/2004 | Gomm et al. | 331/10 |
| 6,803,826 B2 | 10/2004 | Gomm et al. | 331/11 |
| 6,812,760 B1 | 11/2004 | Kim et al. | 327/158 |
| 6,836,166 B2 | 12/2004 | Lin et al. | 327/158 |
| 6,895,522 B2 | 5/2005 | Johnson et al. | 713/401 |
| 6,919,745 B2 | 7/2005 | Lee et al. | 327/149 |
| 6,937,076 B2 * | 8/2005 | Gomm | 327/158 |
| 6,975,149 B2 | 12/2005 | Mikhalev et al. | 327/158 |
| 6,987,408 B2 * | 1/2006 | Kim | 327/158 |
| 7,010,014 B1 * | 3/2006 | Percey et al. | 375/130 |
| 7,078,950 B2 * | 7/2006 | Johnson | 327/158 |
| 7,088,156 B2 | 8/2006 | Kim | 327/149 |
| 2002/0000854 A1 | 1/2002 | Hashimoto | 327/158 |
| 2002/0000855 A1 | 1/2002 | Lee | 327/158 |
| 2002/0036527 A1 | 3/2002 | Yoneda | 327/158 |
| 2002/0043996 A1 | 4/2002 | Iwamoto | 327/158 |
| 2002/0089361 A1 | 7/2002 | Stubbs et al. | 327/161 |
| 2002/0130691 A1 | 9/2002 | Silvestri | 327/158 |
| 2003/0034815 A1 | 2/2003 | Lin | 327/158 |
| 2003/0067330 A1 | 4/2003 | Mikhalev et al. | 327/158 |
| 2003/0067332 A1 | 4/2003 | Mikhalev et al. | 327/158 |
| 2003/0080791 A1 | 5/2003 | Fiscus | 327/158 |
| 2004/0036515 A1 | 2/2004 | Mikhalev et al. | 327/158 |
| 2004/0046597 A1 | 3/2004 | Alon et al. | 327/278 |
| 2004/0140836 A1 | 7/2004 | Miller | 327/233 |
| 2004/0213051 A1 | 10/2004 | Lin et al. | 365/194 |
| 2005/0035799 A1 | 2/2005 | Mikhalev et al. | 327/158 |
| 2006/0044931 A1 | 3/2006 | Kim | 365/233 |
| 2006/0045227 A1 | 3/2006 | Guan | 375/376 |

* cited by examiner

DELAY-LOCKED LOOP HAVING A PRE-SHIFT PHASE DETECTOR

CROSS-REFERENCE TO RELATED APPLICATION

This application is a divisional of U.S. patent application Ser. No. 10/931,354, filed Aug. 31, 2004, now U.S. Pat. No. 7,088,156.

TECHNICAL FIELD

The present invention relates generally to synchronous circuits, and more particularly, to an apparatus and method that provides fast and stable synchronization of clock signals following initialization of a synchronous circuit.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, data are placed on a data bus by the memory device in synchronism with the external clock signal, and the memory device must provide the data at the proper times for the data to be valid. To provide the data at the correct times, an internal clock signal is developed in response to the external clock signal, and is typically applied to data latches in the memory device to thereby clock the data onto the data bus. The internal clock signal and external clock must be synchronized to ensure the internal clock signal clocks the latches at the proper times to successfully output the data at the proper times. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some delay, causing the internal clock signal to be phase shifted relative to the external clock signal. As long as the phase-shift is minimal, timing within the memory device can be easily synchronized to the external timing. To increase the rate at which data can be transferred to and from the memory device, the frequency of the external clock signal is increased, and in modern synchronous memories the frequency is in excess of 100 MHz. As the frequency of the external clock signal increases, however, the delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the data applied to the data bus may not be valid at the proper times to be latched.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. As shown in FIG. 1, the variable delay 102 includes a bank of registers and a delay line. The delay line of the variable delay 102 includes a plurality of delay stages (not shown) that can be individually activated and deactivated to incrementally increase and decrease the variable delay VD by a delay tD. The bank of registers is used to store a value represented by the DADJ signal that corresponds to the number of delay stages that are activated. In order to change the delay of the variable delay VD, the value stored by the bank of registers should be changed.

A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed. For example, the output buffer 108 may represent all of components in a data path in the memory device through which the data propagates to be provided onto the data bus. The CLKSYNC signal can then be used to clock the output data latches such that the data is provided in synchronicity with the CLK signal applied to the memory device.

The delay-locked loop 100 further includes a phase detector 110 that receives the CLKFB and CLKBUF signals and generates a delay control signal SL/SR that is based on the phase difference between the CLKBUF and CLKFB signals. A delay controller 112 generates the DADJ signal in response to the SL/SR signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals. As previously discussed, the variable delay line 102 includes a bank of registers that stores a value represented by the DADJ signal that corresponds to the number of delay stages that are activated. The delay stages can be conceptualized as a chain of delay stages that are activated in a "left-to-right" manner, with each of the activated delay stages adding an incremental delay to the variable delay VD. The SL/SR signal generated by the phase detector 110 represents a "shift left" (SL) or "shift right" (SR) command that is used by the delay controller to increase or decrease, respectively, the variable delay VD of the variable delay line 102. That is, each SL signal from the phase detector 110 will be used by the delay controller 112 to incrementally increase the variable delay VD and each SR signal from the phase detector 110 will be used by the delay controller 112 to incrementally decrease the variable delay VD.

FIG. 2 illustrates an example of the phase detector 110. The phase detector 110 includes a first fixed delay 256 that provides a delay of tPDW to the CLKFB signal to generate a delayed feedback clock signal CLKFB2D. A second fixed delay 258 provides a delay of tPDW/2, that is, half of the delay provided by the first fixed delay 256, to the CLKBUF signal to generate a delayed reference clock signal CLK-BUFD. The CLKBUFD signal is used to clock a set of D flip-flops 260, 262 which sample the CLKFB signal and the CLKFB2D signal. The D flip-flops 262 and 260 output signals PH1 and PH2, respectively, to a majority filter 266. The values of the PH1 and PH2 signals at any given instant are indicative of the phase of the CLKFB signal with respect to the CLKBUF signal. The phase relationship between the PH1 and PH2 signals are used to determine whether to lengthen or shorten the variable delay VD of the variable delay line 102 (FIG. 1).

The majority filter 266 coupled to the D flip-flops 260, 262 generates the SL/SR signal based on the PH1 and PH2 signals and in response to a counting clock signal COUN-TCLK. The CLK or CLKBUF signals can be used for the COUNTCLK signal. The majority filter 266 typically includes a binary up/down counter (not shown) that is clocked by the COUNTCLK signal and counts up or down based on the values of PH1 and PH2 signals. Typically, in an effort to reduce jitter of the SL/SR signal, the majority filter 266 is designed to switch the state of the SL/SR signal only after the up/down counter is incremented or decremented a fixed number. For example, before the up/down counter generates a SL/SR signal to adjust the variable delay VD, the up/down counter must count up or down for four cycles (c=4) of the COUNTCLK signal.

The operation of the DLL 100 will now be described with reference to FIG. 1. The phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted, the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKSYNC signal corresponds to the internal clock signal.

After the DLL 100 is reset, for example, when the DLL 100 is initialized or restarted after exiting a sleep mode, the variable delay VD of the variable delay line 102 is typically set to its minimum delay. In order to obtain a lock condition, the variable delay VD is incrementally increased from the minimum delay to a delay under the control of the phase detector 110 that will provide a lock condition. As previously discussed, the variable delay VD is incrementally increased by adding fixed increments of delay through the use of the delay stages in the variable delay line 102. With the phase detector 110 comparing the phases of the CLK-BUF and CLKFB signals, an intrinsic delay tID exists between when an adjustment is made to the variable delay VD and when the CLKFB signal having the additional delay is detected by the phase detector 110 and compared with the CLKBUF signal. The length of tID is in part based on the delay of the variable delay VD and the feedback delay line 104. As a result, the variable delay VD is increased by the incremental delay of one delay stage after the intrinsic delay tID has elapsed. The design of the majority filter 266, which generates an SL/SR signal to increment the delay of the variable delay line 102 only after a number of clock cycles of the COUNTCLK signal, further adds to the time required to obtain a lock condition. As a result, the process of obtaining a lock condition with the DLL 100 typically takes several iterations of incrementally adding a delay and detecting whether sufficient delay has been added. In the case where significant delay must be added to obtain a lock condition, the process of incrementally adding the delay will take considerable time. As performance specifications for obtaining a lock condition are often defined in the number of clock cycles elapsed, the time for obtaining a lock condition may be tolerable for lower frequency CLK signals that have clock periods comparable to the intrinsic delay tID. However, using higher frequency CLK signals having clock periods that are a fraction of the intrinsic delay tID may result in an unacceptable number of clock cycles required to obtain a lock condition.

One approach to decreasing the lock time for a DLL is to automatically increment the variable delay VD every clock cycle, or every other clock cycle of the CLK signal following initialization, to quickly increase the variable delay VD until phase detector 110 detects that the CLKBUF and CLKFB signals are synchronized. Although forcing the variable delay VD to increase incrementally every clock cycle can decrease locking time, there may be overshoot in the variable delay VD for higher frequency CLK signals. That is, due to the intrinsic delay tID, the variable delay VD may continue to be incrementally increased even after the variable delay VD is sufficient to provide a lock condition, as detected by the phase detector 110. In the event of overshooting the appropriate delay, the variable delay VD will need to be decreased to return to the appropriate delay to obtain a lock condition. The process of decrementing the variable delay VD will suffer from the same issues as for incrementing the variable delay VD after initialization, that is, it will take several clock cycles to complete the process because of the intrinsic delay tID and the design of the majority filter 266 (FIG. 2).

Therefore, there is a need for a DLL having the ability to quickly obtain a lock condition following initialization.

SUMMARY OF THE INVENTION

Embodiments of the present invention are directed to a clock generator for generating an output clock signal synchronized with an input clock signal that includes first and second adjustable delay lines. A first adjustable delay lines is adjusted following initialization of the clock generator to expedite obtaining a lock condition following the initialization. A second adjustable delay line is adjusted after synchronization is achieved with the first adjustable delay line, or when the first adjustable delay line reaches a maximum delay. The first adjustable delay line is reset when a lock condition is initially obtained, and the second adjustable delay line is adjusted to compensate for the reset first adjustable delay line. In one aspect of the invention, the phases of the input clock signal and the output clock signal are compared and a first adjustable delay line is adjusted from a first minimum delay to a first delay based on the phase comparison to synchronize the input clock signal and the output clock signal. Data representing the length of the first delay is stored and the first adjustable delay is reset to the first minimum delay. A second adjustable delay line is adjusted from a second minimum delay to a second delay approximately equal to the first delay based on the stored data.

In another aspect of the invention, a first adjustable delay line is adjusted from a first minimum delay to a first maximum delay to generate a feedback clock signal having the first maximum delay relative to the output clock signal. The phases of the input clock signal and the feedback clock signal are compared, and a second adjustable delay line is adjusted from a second minimum delay to a second delay based on the phase comparison to synchronize the input clock signal and the feedback clock signal. The first adjustable delay is reset to the first minimum delay in response to the input clock signal and the feedback clock signal being synchronized, and the second delay of the second adjustable delay line is increased by a third delay that is approximately equal to first maximum delay.

DETAILED DESCRIPTION

Embodiments of the present invention are directed to a delay-locked loop (DLL) having a phase detector that includes a pre-shift variable delay line used to expedite obtaining a lock condition following initialization of the DLL. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
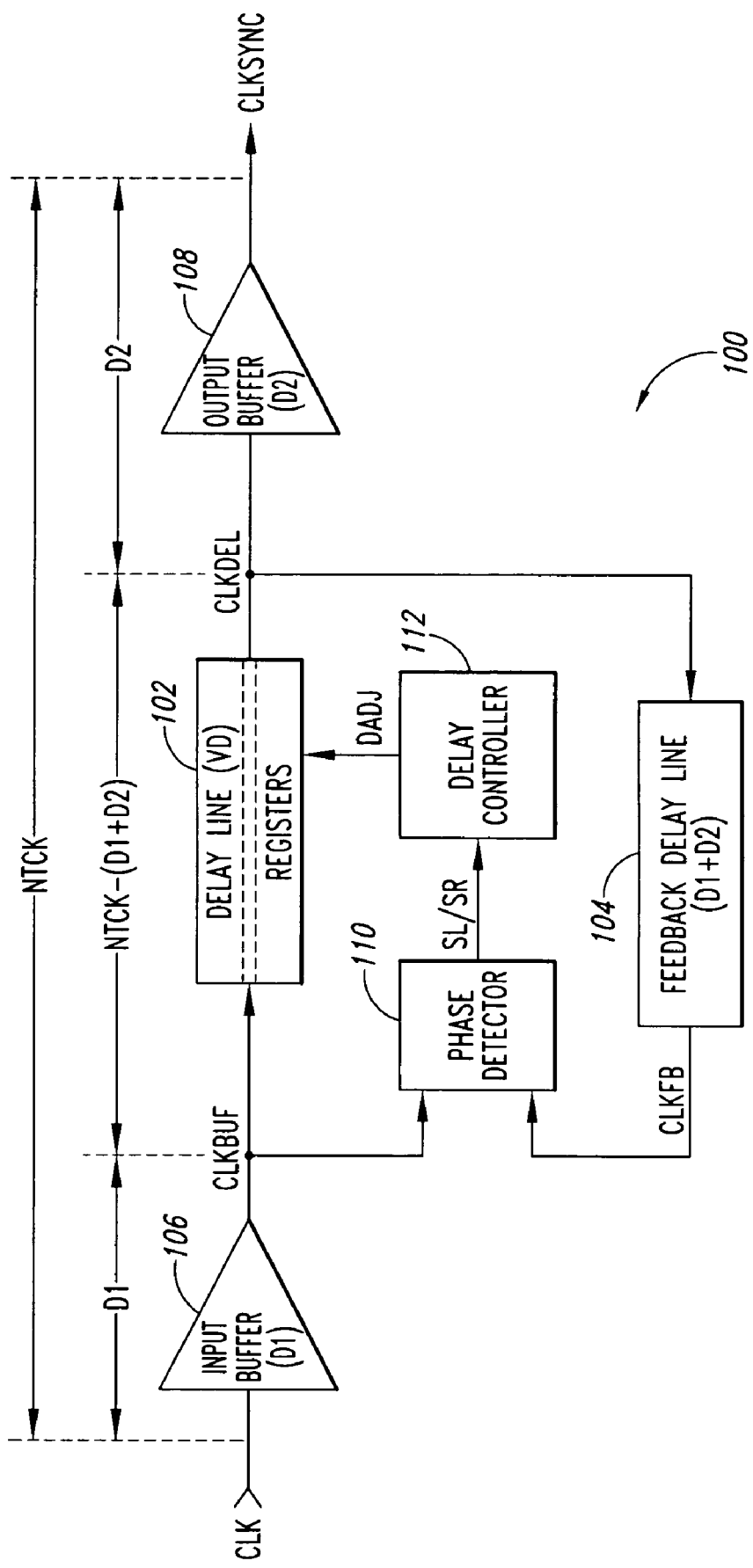
FIG. 1 is a functional block diagram of a conventional delay-locked loop (DLL).
Figure 2:
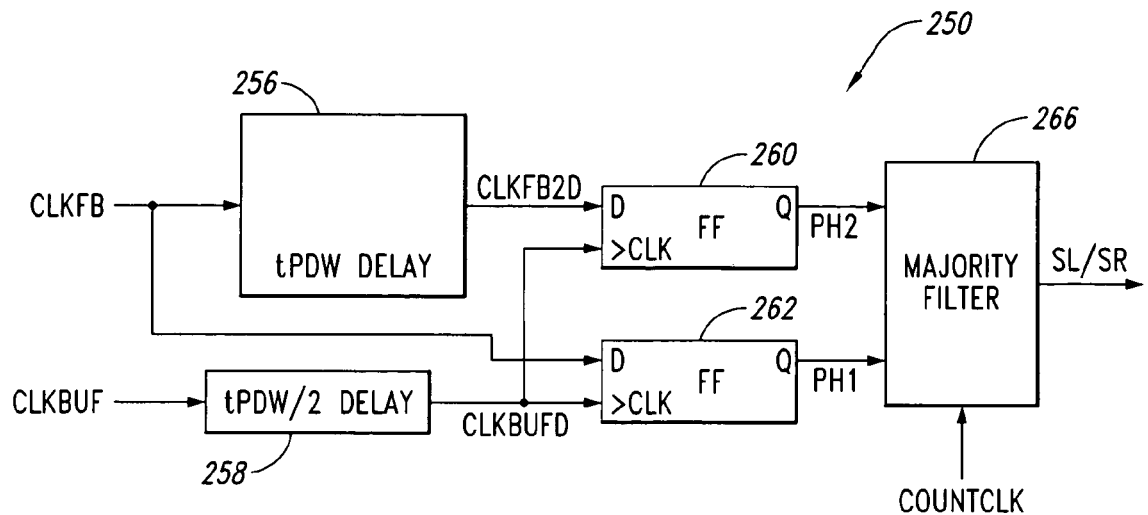
FIG. 2 is a functional block diagram of a conventional phase detector of the DLL of FIG. 1.
Figure 3:
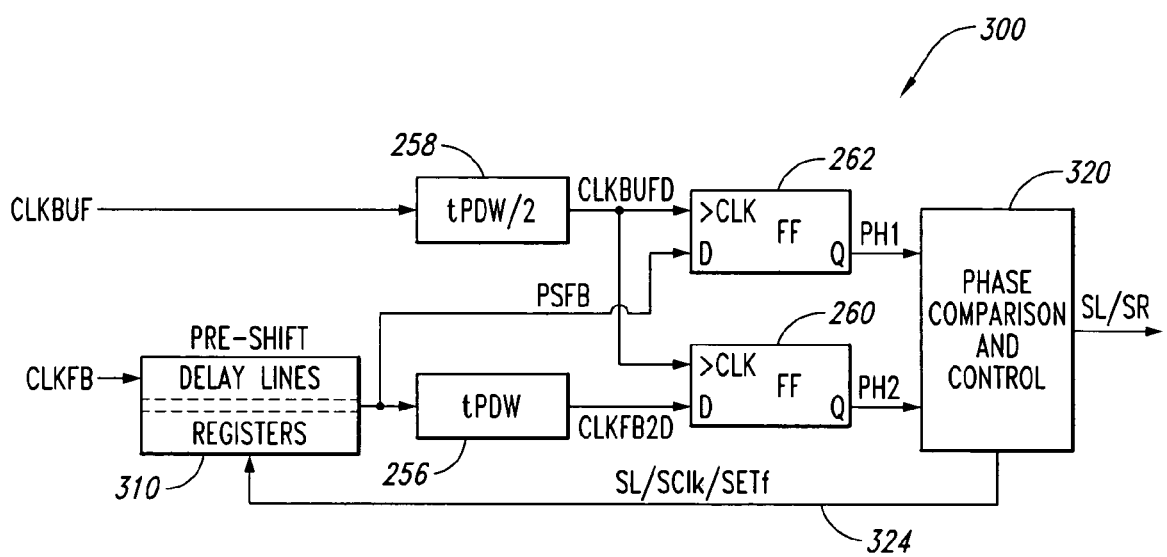
FIG. 3 is a functional block diagram of a phase detector according to an embodiment of the present invention that can be used in place of the phase detector of the DLL shown in FIG. 1.

FIG. 3 illustrates a phase detector 300 according to an embodiment of the present invention. The phase detector 300 can be substituted for the phase detector 110 of the DLL 100 of FIG. 1. The phase detector 300 includes common functional blocks previously described with respect to the phase detector 250 of FIG. 2, and where appropriate, the same reference numbers used in FIG. 2 have been used in FIG. 3. The phase detector 300 includes first and second fixed delays 256 and 258 to provide a delayed feedback clock signal CLKFB2D and a delayed reference clock signal CLKBUFD. The CLKBUFD signal is a delayed version of the CLKBUF signal, and the CLKFB2D signal is a delayed version of a pre-shift feedback signal PSFB output by a pre-shift variable delay line 310. The PSFB signal is a delayed version of the CLKFB signal (FIGS. 1 and 2) that has been delayed by a pre-shift variable delay (PSVD). The pre-shift variable delay PSVD is set by the value programmed in a bank of registers included in the pre-shift variable delay line 310. The pre-shift variable delay line 310 further includes a plurality of delay stages (not shown). When activated, each delay stage of the pre-shift variable delay line 310 adds an incremental delay. The incremental delay of each delay stage is equal to the delay of each delay stage of the variable delay line 102 (FIG. 1). The CLKBUFD signal is used to clock D flip-flops 260 and 262. The PSFB signal output by the pre-shift variable delay line 310 is coupled to the input of the D flip-flop 262 and the CLKFB2D signal output by the first fixed delay 256 is coupled to the input of the D flip-flop 260. The output signals PH1, PH2 of the D flip-flops 260, 262, respectively, are coupled to a phase comparison and control circuit 320 which generates the SL/SR signal used to adjust the variable delay VD of the variable delay line 102. The phase comparison and control circuit 320 is also coupled to the pre-shift variable delay line 310 to provide a control signal 324 that is used to, among other things, set the length of the pre-shift variable delay PSVD, reset the PSVD, and disable the pre-shift variable delay line 310.

In operation, the phase detector 300 uses the pre-shift variable delay line 310 to quickly set a delay that will facilitate obtaining a lock condition after initialization of a DLL in which the phase detector 300 is employed. As previously discussed, it is desirable for a DLL to quickly obtain a lock condition after the DLL is initialized, for example, after a device in which the DLL is included is initially powered-up, or the DLL is restarted after exiting a sleep mode. As also previously discussed, quickly obtaining a lock condition to a high-frequency clock signal is especially difficult due to the intrinsic delay tID of the feedback loop of conventional DLLs. In contrast to conventional DLLs, the phase detector 300 includes the pre-shift variable delay line 310 and the phase comparison and control circuit 320 to expedite obtaining a lock condition.

Operation of the phase detector 300 will now be described with respect to the DLL 100 (FIG. 1) having the phase detector 300 substituted for the phase detector 110. Following initialization of the DLL 100, the variable delay VD of the variable delay line 102 and the pre-shift variable delay PSVD of the pre-shift variable delay line 310 of the phase detector 300 are set to their respective minimum delays. The minimum delays of the variable delay line 102 and the pre-shift variable delay line 310 preferably do not add any delay to an input clock signal. That is, there is no delay added by the respective variable delay lines 102, 310. With the variable delay VD of the variable delay line 102 not adding any delay, the CLKFB signal provided to the phase detector 300 is the CLKBUF signal with only the delay from the feedback delay line 104 added. Typically, a conventional phase detector 110 will generate a SL/SR signal following initialization of the DLL 100 in response to the CLKBUF and CLKFB signals to incrementally increase the variable delay VD of the variable delay line 102. The SL/SR signal is then provided to the delay controller 112 which generates a DADJ signal to adjust the variable delay VD of the variable delay line 102. In contrast, the phase detector 300 does not provide a SL/SR signal to the delay controller 112 immediately after initialization, but rather, generates a control signal 324 in response to the CLKBUF and CLKFB signals to increase the pre-shift variable delay PSVD of the pre-shift variable delay line 310.

The pre-shift variable delay line 310 behaves as a substitute for the variable delay line 102 following initialization of the DLL 100. In this manner, the intrinsic delay tID of the feedback loop of the DLL 100 through the variable delay line 102 and the feedback delay line 104 can be avoided. The pre-shift variable delay line 310 is part of a feedback loop that has a intrinsic delay less than the intrinsic delay of the feedback loop through the variable delay line 102 and the feedback delay line 104. The delay inserted into the feedback loop by the pre-shift variable delay line 310 can be detected and adjusted quickly to obtain a lock condition between CLKFB and CLKBUF signals. In addition to adjusting the pre-shift variable delay PSVD of the pre-shift variable delay line 310, the phase comparison and control circuit 320 tracks the setting of the pre-shift variable delay line 310 required to obtain a lock condition between the CLKFB and the CLKBUF signals. That is, the number of activated delay stages of the pre-shift variable delay line 310 needed to synchronize the CLKFB and CLKBUF signals is recorded by the phase comparison and control circuit 320. When a lock condition is obtained, the phase comparison and control circuit 320 resets the pre-shift variable delay PSVD of the pre-shift variable delay line 310 to its minimum delay, and further generates a SL/SR signal for the delay controller 112 to quickly adjust the variable delay VD of the variable delay line 102 to the pre-shift variable delay PSVD of the pre-shift variable delay line 310 that was required to synchronize the CLKFB and CLKBUF signals.

In one embodiment of the invention, the phase comparison and control circuit 320 generates a SL/SR signal to incrementally increase the delay of the variable delay line 102 every clock cycle of a clock signal, such as the CLKBUF signal, until the number of activated delay stages in the variable delay line 102 is equal to the number of delay stages of the pre-shift variable delay line 310 that were activated to synchronize the CLKBUF and CLKFB signals. In this embodiment, the delay of each delay stage of the variable delay line 102 and the pre-shift variable delay line 310 are the same and the number of delay stages in the pre-shift variable delay line 310 is sufficient to provide enough delay to obtain a lock condition. Consequently, if the number of activated delay stages of the variable delay line 102 are equal to the number of delay stages of the pre-shift variable delay line 310 that were activated, the overall delay of the variable delay line 102 will be sufficient to synchronize the CLKBUF and CLKFB signals for the DLL 100. In an alternative embodiment, the number of delay stages of the pre-shift delay line 310 can be equal to or greater than the number of delay stages in the variable delay line 102.

In an alternative embodiment of the present invention, the maximum delay of the pre-shift variable delay line 310 is insufficient to synchronize the CLKBUF and CLKFB signals. When the maximum delay of the pre-shift variable delay 310 is reached, the phase comparison and control circuit 320 will begin to increment the variable delay VD every clock cycle, or every other clock cycle until the CLKBUF and CLKFB signals are synchronized. When synchronization is achieved, the phase comparison and control circuit 320 resets the pre-shift variable delay PSVD of the pre-shift variable delay line 310 to its minimum delay and increases the variable delay VD of the variable delay line 102 by the same amount. In the event that overshoot of the variable delay VD is anticipated due to adding incremental delay every, or every other clock cycle, the phase comparison and control circuit 320 can be configured to wait several clock cycles after resetting the pre-shift variable delay PSVD before determining whether the variable delay VD should be further increased.

Consideration of the intrinsic delay tID of the DLL feedback loop should be made in selecting the number of clock cycles to wait after the pre-shift variable delay PSVD is reset. Additionally, determining the number of delay stages of the pre-shift variable delay line 310 can be based on the intrinsic delay tID as well. For example, the number of cycles to wait after resetting the pre-shift variable delay PSVD should be selected so the wait time it is approximately equal to the intrinsic delay tID of the DLL feedback loop. In this manner, incremental increases in the variable delay VD from automatically adding delay every clock cycle after the maximum delay of the pre-shift variable delay line 310 has been reached will have sufficient time to propagate through to the phase detector 300. After the wait time has elapsed, the phase detector 300 can then determine whether the variable delay VD will need to be further adjusted by comparing the CLKBUF signal to the CLKFB signal having the true delay added by the variable delay VD.

Selecting the number of delay stages in the pre-shift variable delay line to be equal to the number of clock cycles of the wait time complements the wait time in avoiding overshoot of the variable delay VD. That is, after the maximum delay of the pre-shift variable delay line 310 is reached, and the variable delay VD is incrementally increased every clock cycle until the CLKBUF and CLKFB signals are synchronized, resetting the pre-shift variable delay PSVD will reduce the variable delay VD by the same delay that will be added by the incremental increases propagating through to the phase detector 300 during the wait time. In this manner, after the wait time has elapsed, the variable delay VD does not need to be further increased by the maximum pre-shift variable delay PSVD. Generally, the total delay from the incremental increases propagating to the phase detector 300 during the wait time will be equal to the maximum pre-shift variable delay PSVD. Consequently, the amount of overshoot can be minimized.

Figure 4:
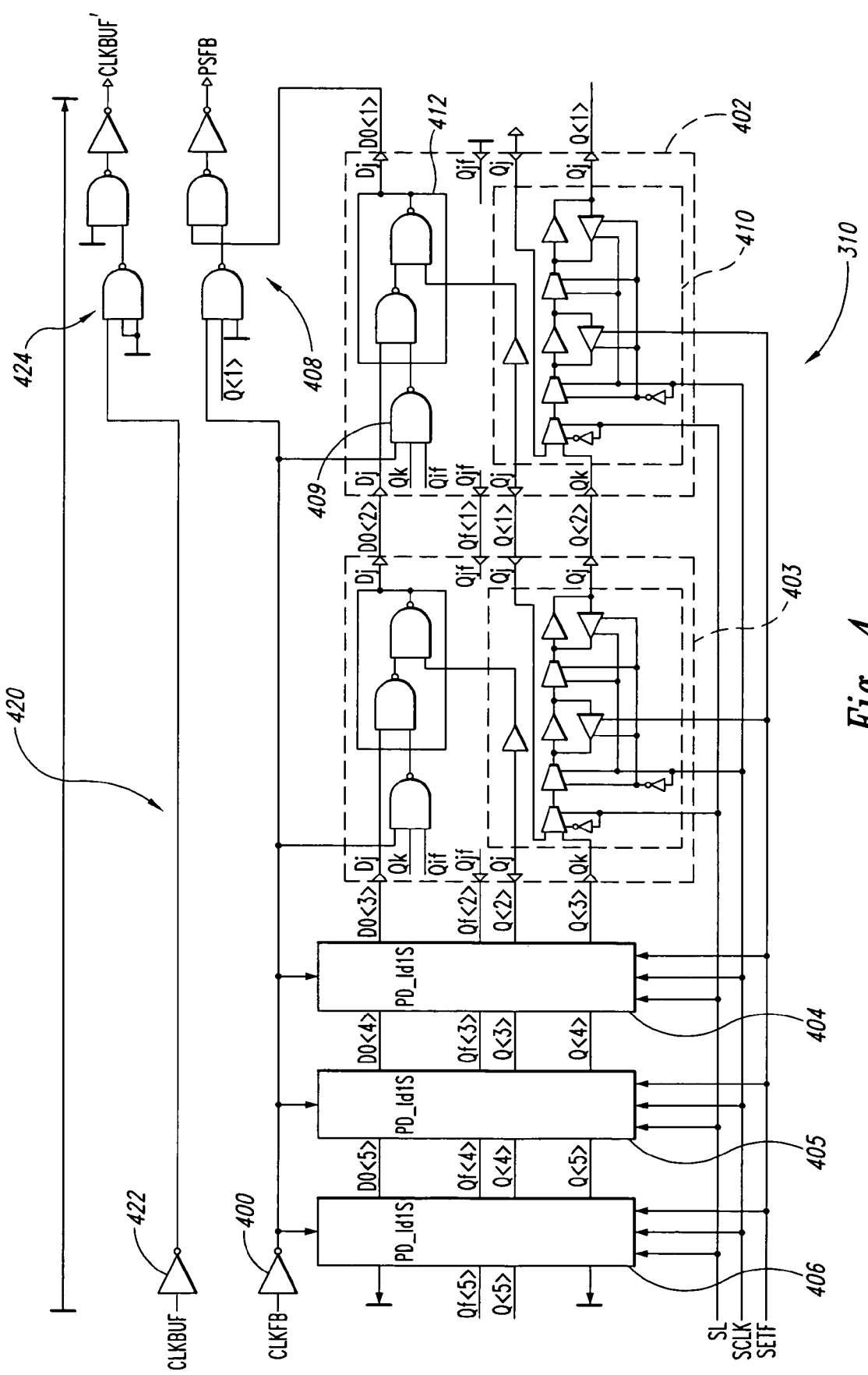
FIG. 4 is a schematic drawing of a pre-shift variable delay line of the phase detector of FIG. 3.

FIG. 4 illustrates the pre-shift variable delay line 310 according to an embodiment of the present invention. It will be appreciated, however, that alternative designs for the pre-shift variable delay line 310 can be used as well without departing from the scope of the present invention. The pre-shift variable delay line 310 includes an input inverter 400, delay stages 402-406, and an output logic circuit 408. In FIG. 4, the delay stages 402 and 403 are shown in detail. The delay stages 404-406 are identical to the delay stages 402 and 403, and operation of the delay stages 402-406 are the same as well. Each of the delay stages 402-406 include an input logic circuit 409, a shift register cell 410, and a delay element 412. As shown in FIG. 4, the signals are provided to the delay stages 402-406 as the control signals, namely, a shift-left signal SL, a shift clock signal SCLK, and a reset signal SETF.

In operation, the CLKFB signal is applied to an input of the input inverter 400 to provide an inverted CLKFB signal to each of the delay stages 402-406. The PSFB signal output by the pre-shift variable delay 310 will have a delay relative to the CLKFB signal based on the number of activated delay stages. When reset by the SETF signal, none of the delay stages 402 are activated to set the minimum delay of the pre-shift variable delay line 310. Although there is a propagation delay between the CLKFB and the PSFB signals due to the output logic circuit 408, the propagation delay will be ignored to avoid obscuring explanation of the operation of the pre-shift variable delay 310. In order to incrementally add delay, a combination of SL and SCLK pulses are provided by the phase comparison and control circuit 320 (FIG. 3) to activate the next delay stage in the chain of delay stages 402-406. Thus, each succeeding combination of the SL and SCLK pulses will incrementally add delay. In order to reduce the delay of the pre-shift variable delay line 310, a SCLK pulse is provided by the phase comparison and control circuit 320. The SCLK pulse deactivates the last activated delay stage 402-406. Each succeeding SCLK pulse will deactivate the previous delay stage 402-406 in the delay chain, thereby reducing the pre-shift variable delay PSVD by one delay stage. As previously discussed, the delay of the pre-shift variable delay 310 can be quickly reset using the SETF signal.

In an alternative embodiment, the pre-shift variable delay line 310 further includes a propagation delay line 420 for the CLKBUF signal. The propagation delay line 420 includes an input inverter 422 and an output logic circuit 424. If desired, the propagation delay line 420 can be included in the pre-shift variable delay line 310 to add the same propagation delay added to the CLKFB signal through the pre-shift variable delay line 310 to maintain the same relative phase between the CLKBUF and CLKFB signals. It will be appreciated that the output of the propagation delay line 420 can be applied to the input of the second fixed delay 258 (FIG. 3) when included in the pre-shift variable delay line 310.

Figure 5:
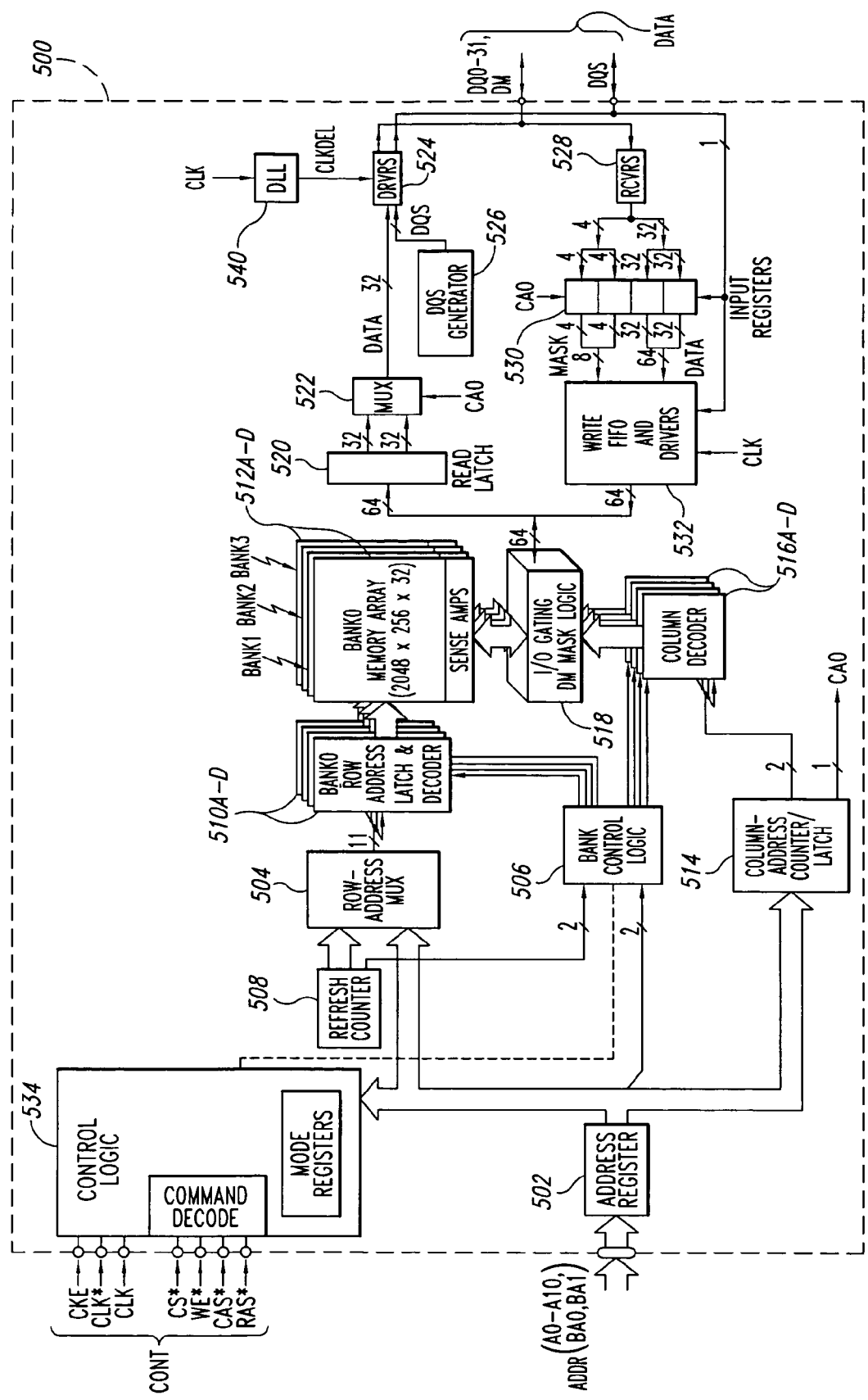
FIG. 5 is a functional block diagram illustrating a synchronous memory device including a DLL having the phase detector of FIG. 3.

FIG. 5 is a functional block diagram of a memory device 500 including a delay-locked loop 540 that includes a phase detector according to an embodiment of the present invention. The memory device 500 in FIG. 5 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A-D. The bank control logic 506 activates the row address latch and decoder 510A-D corresponding to either the bank address received from the address register 502 or a refresh bank address from the refresh counter 508, and the activated row address latch and decoder latches and decodes the received row address. In response to the decoded row address, the activated row address latch and decoder 510A-D applies various signals to a corresponding memory bank 512A-D to thereby activate a row of memory cells corresponding to the decoded row address. Each memory bank 512A-D includes a memory-cell array having a plurality of memory cells arranged in rows and columns, and the data stored in the memory cells in the activated row is stored in sense amplifiers in the corresponding memory bank. The row address multiplexer 504 applies the refresh row address from the refresh counter 508 to the decoders 510A-D and the bank control logic circuit 506 uses the refresh bank address from the refresh counter when the memory device 500 operates in an auto-refresh or self-refresh mode of operation in response to an auto- or self-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. Depending on the operating mode of the memory device 500, the column address counter and latch 514 either directly applies the latched column address to the decoders 516A-D, or applies a sequence of column addresses to the decoders starting at the column address provided by the address register 502. In response to the column address from the counter and latch 514, the activated column decoder 516A-D applies decode and control signals to an I/O gating and data masking circuit 518 which, in turn, accesses memory cells corresponding to the decoded column address in the activated row of memory cells in the memory bank 512A-D being accessed.

During data read operations, data being read from the addressed memory cells is coupled through the I/O gating and data masking circuit 518 to a read latch 520. The I/O gating and data masking circuit 518 supplies N bits of data to the read latch 520, which then applies two N/2 bit words to a multiplexer 522. In the embodiment of FIG. 3, the circuit 518 provides 64 bits to the read latch 520 which, in turn, provides two 32 bits words to the multiplexer 522. A data driver 524 sequentially receives the N/2 bit words from the multiplexer 522 and also receives a data strobe signal DQS from a strobe signal generator 526 and a delayed clock signal CLKDEL from the delay-locked loop 300/700/730. The DQS signal is used by an external circuit such as a memory controller (not shown) in latching data from the memory device 500 during read operations. In response to the delayed clock signal CLKDEL, the data driver 524 sequentially outputs the received N/2 bits words as a corresponding data word DQ, each data word being output in synchronism with a rising or falling edge of a CLK signal that is applied to clock the memory device 500. The data driver 524 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL is a delayed version of the CLK signal, and the delay-locked loop 540 adjusts the delay of the CLKDEL signal relative to the CLK signal to ensure that the DQS signal and the DQ words are placed on the DATA bus in synchronism with the CLK signal, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 528 receives each DQ word and the associated DM signals, and applies these signals to input registers 530 that are clocked by the DQS signal. In response to a rising edge of the DQS signal, the input registers 530 latch a first N/2 bit DQ word and the associated DM signals, and in response to a falling edge of the DQS signal the input registers latch the second N/2 bit DQ word and associated DM signals. The input register 530 provides the two latched N/2 bit DQ words as an N-bit word to a write FIFO and driver 532, which clocks the applied DQ word and DM signals into the write FIFO and driver in response to the DQS signal. The DQ word is clocked out of the write FIFO and driver 532 in response to the CLK signal, and is applied to the I/O gating and masking circuit 518. The I/O gating and masking circuit 518 transfers the DQ word to the addressed memory cells in the accessed bank 512A-D subject to the DM signals, which may be used to selectively mask bits or groups of bits in the DQ words (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 534 latches and decodes an applied command, and generates a sequence of clocking and control signals that control the components 502-532 to execute the function of the applied command. The clock enable signal CKE enables clocking of the command decoder 534 by the clock signals CLK, CLK*. The command decoder 534 latches command and address signals at positive edges of the CLK, CLK* signals (i.e., the crossing point of CLK going high and CLK* going low), while the input registers 530 and data drivers 524 transfer data into and from, respectively, the memory device 500 in response to both edges of the data strobe signal DQS and thus at double the frequency of the clock signals CLK, CLK*. This is true because the DQS signal has the same frequency as the CLK, CLK* signals. The memory device 500 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 534 in generating the control and timing signals is conventional, and thus, for the sake of brevity, will not be described in more detail.

Figure 6:
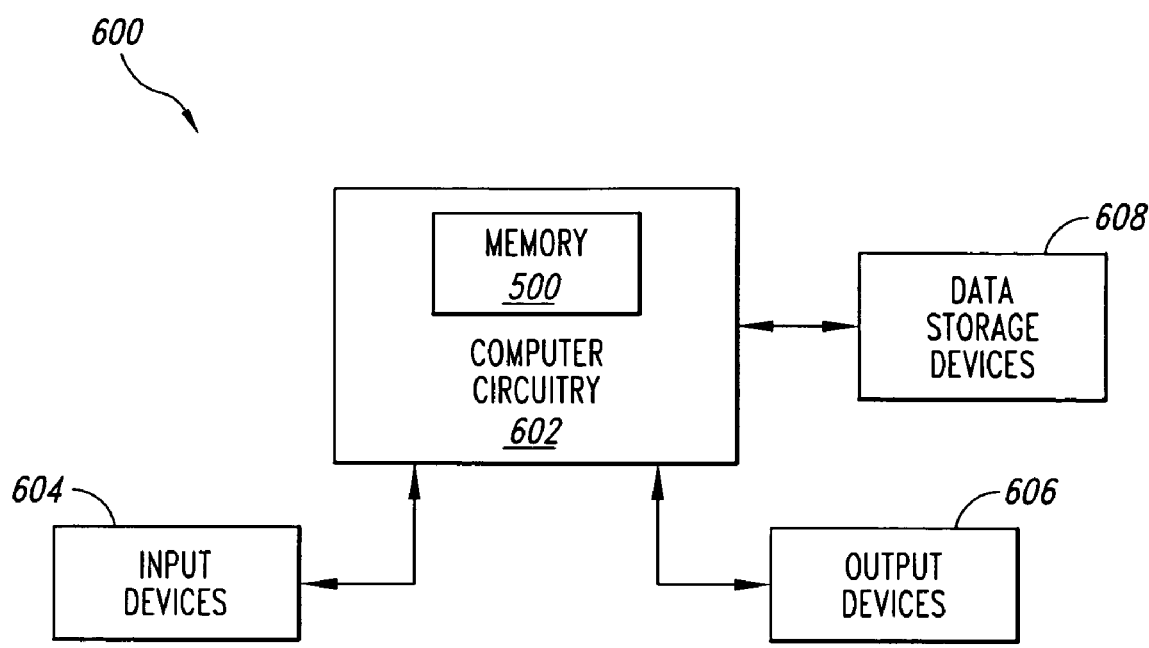
FIG. 6 is a functional block diagram illustrating a computer system including a synchronous memory device of FIG. 5.

FIG. 6 is a block diagram of a computer system 600 including computer circuitry 602 including the memory device 500 of FIG. 5. Typically, the computer circuitry 602 is coupled through address, data, and control buses to the memory device 500 to provide for writing data to and reading data from the memory device. The computer circuitry 602 includes circuitry for performing various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such as output devices typically including a printer and a video terminal. One or more data storage devices 608 are also typically coupled to the computer circuitry 602 to store data or retrieve data from external storage media (not shown). Examples of typical storage devices 608 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for generating an output clock signal synchronized with an input clock signal, the method comprising:
    comparing phases of the input clock signal and the output clock signal;
    adjusting a first adjustable delay line from a first minimum delay to a first delay based on the phase comparison to synchronize the input clock signal and the output clock signal;
    storing data representing the length of the first delay;
    resetting the first adjustable delay to the first minimum delay; and
    adjusting a second adjustable delay line from a second minimum delay to a second delay based on the stored data, the second delay approximately equal to the first delay.

2. The method of claim 1 wherein adjusting a first adjustable delay from the first minimum delay comprises activating a next delay stage in a chain of delay stages until the input clock signal and the output clock signal are synchronized, each delay stage in the chain having a stage delay.

3. The method of claim 1 wherein adjusting the second adjustable delay line to a second delay approximately equal to the first delay comprises activating a same number of delay stages of the second adjustable delay line as activated in the first adjustable delay line to synchronize the input clock signal and the output clock signal.

* * * * *